(12) United States Patent
Lin et al.

(10) Patent No.: US 6,599,665 B1
(45) Date of Patent: Jul. 29, 2003

(54) METHOD OF MAKING A SEMICONDUCTOR WAFER IMAGING MASK HAVING UNIFORM PATTERN FEATURES

(75) Inventors: Shy-Jay Lin, Yong-Ho town (TW); Sheng-Chi Chin, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 87 days.

(21) Appl. No.: 09/686,099

(22) Filed: Oct. 10, 2000

(51) Int. Cl.[7] .............................. G03F 9/00; G03C 5/00
(52) U.S. Cl. ........................................ 430/5; 430/323
(58) Field of Search ........................... 430/5, 322, 323, 430/324

(56) References Cited

U.S. PATENT DOCUMENTS 5,804,339 A * 9/1998 Kim ............................. 430/5
6,001,512 A * 12/1999 Tzu et al. .................... 430/5

* cited by examiner

Primary Examiner—Mark F. Huff
Assistant Examiner—Saleha R. Mohamedulla
(74) Attorney, Agent, or Firm—Tung & Associates

(57) ABSTRACT

A mask used to image circuit patterns onto a semiconductor wafer exhibits improved uniformity of critical feature dimensions. A pattern of dummy features is formed around the outer periphery of the main pattern during manufacture of the mask. The presence of the dummy field eliminates loading of the etch rate at the marginal areas of the main pattern, thereby assuring that all of the features in the main pattern field are etched at substantially the same rate. By using differing radiation dosages to expose the photoresist employed to form the main pattern and dummy patterns, a thickness of the photoresist remains over the dummy field pattern after development of the photoresist. This remaining photoresist has a thickness sufficient to prevent subsequent etching of the underlying metal which would otherwise leave features in the metal layer that would be imaged onto the wafer.

8 Claims, 2 Drawing Sheets

METHOD OF MAKING A SEMICONDUCTOR WAFER IMAGING MASK HAVING UNIFORM PATTERN FEATURES

TECHNICAL FIELD

The present invention generally relates to semiconductor manufacturing processes employing photolithography and etching processes to form circuit patterns on a semiconductor wafer, and deals more particularly with a method of making an improved imaging mask used to image circuit patterns onto the wafer to achieve uniform etch rates across the entire field of imaged circuitry.

BACKGROUND OF THE INVENTION

Well known photolithography processes for forming circuit patterns on semiconductor wafers to produce integrated circuits typically employ a mask for imaging complex circuit patterns onto the wafer. The subsequent semiconductor process is used to form the integrated circuit include chemical and physical film depositions, etching, ion implantation, defusion, annealing or thermal oxidation. Many of these processes require that a pattern of photoresist first be formed on the wafer substrate. The process for patterning the photoresist is referred to as a photolithography process, which involves first depositing a uniform layer of photoresist onto the substrate, next exposing the photoresist layer to optical illumination through the mask, and then developing the exposed photoresist layer. The photoresist layer that results from this process is patterned to form an image that corresponds to the patterns on the mask. Depending upon the type of photoresist used, the image is either a positive one or a negative one.

A conventional mask used in a so-called step and repeat or "stepper" machine consists of a thin layer of chromium (typically 50 nm) deposited and then patterned on a glass or quartz substrate. During the photolithography process, the masked pattern is reduced by a certain factor, for example by a factor of five after it is transferred onto the substrate by a lithographic exposure system forming part of the stepper. This pattern is typically binary i.e. it is either opaque or transparent. In a conventional optical lithography system, the image resolution and the depth of the focus are determined by the wave length of the illumination light and the numeric aperture of the optics, and not by the mask itself.

Over the last decade, innovations in lithography have been directed toward improving resolution and alignment accuracy, increasing throughput and reducing defects. As integrated circuit technology advances, the number of layers in an IC has increased, and as a result, the number of photolithographic process required to fabricate an IC has also increased.

A number of factors have an influence on design limits, circuit performance and defect rate. The minimum image size that can be printed on the surface of a substrate with a specified "fidelity" depends primarily on the resolution of the photographic apparatus and resist properties. Other factors, however, such as process-induced fluctuations in pattern dimensions, device reliability and circuit performance play important roles in determining design guidelines. These factors sometimes restrict the patterns to dimensions that are not at the "photolithographic limit". For example, etching, oxidation and lateral diffusion of dopants can cause the final wafer dimensions to deviate considerably from those defined in a resist; reliability concerns, such as electromigration in metals, may limit the metal width or contact size to dimensions larger than the minimum feature size. Dimensions that must be rigorously controlled during mask inspection and after imaging on the resist to ensure that circuits operated within specifications are called critical dimensions (CD). The imaging process, as well as other factors can cause the average line width that is measured in the resist to be larger or smaller than on the mask. This difference is sometimes referred to as the "bias". Fluctuations in the imaging process cause variations in the resist dimensions. These latter mentioned variations are referred to as tolerances. To some degree, these variations may be taken into consideration when designing the layout of the circuit pattern.

Not all process variations can be compensated for by adjustments in the design layout of the circuit pattern. One such process that materially affects the CD's is that of the etching of the exposed layer of photoresist. In typical plasma reactors, the etch rate is proportional to the concentration of reactive species which, on average, is determined by the difference of the rates of generation and loss of species. In typical plasma reactors, the main loss mechanism of etchants is their consumption by reaction with the material being etched. Therefore, more reactive neutrals are depleted as the etchable surface area is increased. Since the generation of reactive species is independent of the amount of etchable material present, there is a net loss of reactive species which increases as more etchable substrate is exposed. The result is a decrease in the etch rate as the exposed surface area is increased, a phenomena referred to as loading effect. Well known formulas showing the relationship between the etch rates and other variables show that there is negligible loading and the exposed area being etched is very small and/or the lifetime of the active species in the absence of etchable material is small. Therefore, loading defects can be reduced by employing plasmas in which the dominant etch loss mechanism is insensitive to the consumption by reaction.

The most serious concern caused by the loading effect is the loss of etchant control when nearing the "end point" of an etching process, i.e. when a desired amount of photoresist has been removed. Ideally, as the termination of an etch process is approached, the etch rate should decrease to allow stopping the process at the correct time and minimizing over-etching. With the loading effect, however, that etchable material is exposed during the end point and the etch rate increases rapidly, so that over-etching is carried out at a higher rate than nominal. This make line width control extremely difficult, since accelerated etching occurs on clearing.

A microscopic loading effect, in which the etch rate is influenced by the size and density of features, is referred to as microloading. This is the consequence of localized concentrations of gradients of etchant species, which are caused by differing rates of reaction with the patterned surface. For feature sizes below about one micron, and an aspect ratio is much greater than one, etching rates are observed to depend on pattern density and aspect ratio. The term "microloading" is commonly used in the art to describe its dependence of etch rate on the exposed etchable defined by the pattern.

Loading effect can be either global or localized. Global loading effect is dependent upon the total amount of are being etched. However, localized loading effect is effected by the localized density of circuit features, the relative positions of features and the type of materials being etched, where multiple materials are being etched. In connection with semiconductor manufacturing processes for producing conventional integrated circuits, it has been observed that the etch rate of photoresists defining circuit features along the outer periphery of the imaged pattern; and thus of the mask; tend to etch at a higher rate than the main body or the central area of the wafer. This higher etch rate along the marginal area of the overall pattern is due to the loading effect caused by the absence of etchable materials immediately outside the borders of the imaged pattern. In other words, circuit features are present up to and sometimes contiguous with the outside borders of the overall imaged pattern, but etchable material is not present outside the border. As the result, there is less overall etchable material around those circuit features being etched at the marginal area of the field, thus causing them to etch at a higher rate. This loading effect along the outer border of the imaged field results in critical dimensions of circuit features along the border which are lesser in quality than those in the main, central field of the image.

The present invention is directed towards achieving overall uniformity of CD's across the entire area of the imaged pattern.

SUMMARY OF THE INVENTION

According to one aspect of the invention, a method is provided for making a mask used in imaging a pattern of circuit features onto the surface of a semiconductor wafer. The method comprises the steps of: providing a transparent mask plate having a layer of metal formed on one side thereof; forming a layer of photoresist material over the metal layer that covers both a first area defining a main field in which circuit features are to be formed, and over a second area in which dummy circuit features are to be formed; exposing the photoresist layer in the first area using a first level of radiation; exposing the photoresist layer in the second area thereof with radiation having a second level that is less than the first radiation level, whereby the first and second areas of the photoresist layer receive differing dosages of radiation and thus possess differing soluabilities in the presence of a developing solution; and developing the photoresist layer such that a thickness of the photoresist layer remains in covering relationship to the metal layer outside the main field. The photoresist remaining in the second area possesses a thickness dimension sufficient to protectively cover the underlying metal layer during subsequent etching processes used to form circuit features in the metal layer. The un-etched metal layer in the second area of photoresist forms an opaque barrier to the passage of light through the mask during imagining of circuit features in the main field onto the semiconductor wafer.

According to another aspect of the invention, a method is provided for making a mask used in a photolithography process to image a pattern of circuitry onto the surface of a semiconductor wafer, comprising the steps of: forming a main field pattern of circuit features on a mask plate, the circuit features imaged onto the plate along the outer periphery of the main field pattern ordinarily tending to etch at a faster rate during etching of the plate following exposure of the main field pattern onto a layer of photoresist on the plate, compared to the etch rate of circuit features etched, onto central area of the plate; and, forming a dummy pattern of dummy features on the plate, the presence of the dummy features on the plate reducing loading of the rate of etching of the exposed photoresist along the outer periphery of the main field pattern, the dummy field forming step including exposing a layer of photoresist used to form the dummy features to a dosage of radiation less than the dosage of radiation applied to a layer of photoresist used to form the main field pattern, whereby a portion of the thickness of the photoresist layer used to form the dummy field features remains after etching is completed. The remaining thickness of photoresist used to form the dummy field features prevent etching of an underlying metal layer that forms an opaque barrier preventing the dummy field features from being imaged onto the semiconductor wafer.

Accordingly, it is a primary object of the present to provide a method of making a mask plate that eliminates loading effect of the etch rate of circuit features along the outer periphery of the imaged pattern.

Another object of the invention is to provide a method as mentioned above which eliminates the etch loading effect through a simple modification of the imaging mask.

A further object of the present invention is to provide a method as described above which can be carried out using conventional techniques.

Another object of the invention is to provide a method and mask produced thereby as mentioned above that includes a minimum number of manufacturing steps.

These, and further objects and advantages of the present invention will be made clear or will become apparent during the course of the following description of a preferred embodiment of the invention.

BRIEF DESCRIPTION OF THE DRAWINGS

In the drawings which form an integral part of the specification and are to be read in conjunction therewith, and in which like references numerals are employed to designate identical components in the various views.

DESCRIPTION OF THE PREFERRED EMBODIMENTS

Figure 1:
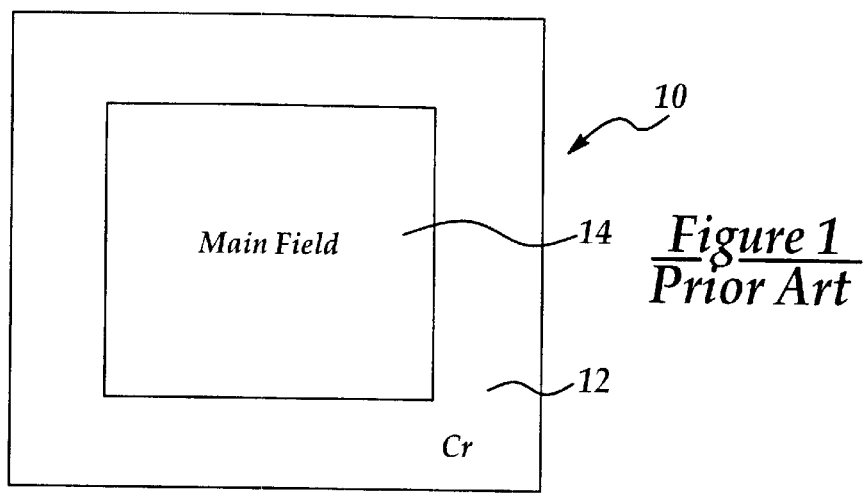
FIG. 1 is a plan view of a typical, prior art imaging mask used in a photolithography process to image circuit patterns onto semiconductor wafers.

Referring first to FIG. 1, a conventional imaging mask generally indicated by the numeral 10, is used in a well-known step and repeat apparatus for imaging circuit patterns onto the surface of a substrate (not shown) such as a semiconductor wafer. The mask 10 may comprise a plate of transparent materials such as glass or quartz through which light may be transmitted by a laser or other source of illumination. One side of the mask 10 is covered by a layer of opaque metal, such as chromium. The metallic layer has the desired circuit pattern formed in a main rectangular field 14, i.e. portions of the chromium layer in the main field 14 are etched away to define the desired circuit pattern which is to be imaged onto the substrate. The outer, peripheral area 12 of chromium is not etched, and thus is completely opaque to light.

As discussed previously, critical dimensions of circuit features appearing in the main field 14 and formed on the substrate are not uniform across the entire area of the main field 14. This lack of uniformity is the result of the tendency of the etch rate of the photoresist on the substrate to be higher at the outer periphery or marginal areas of the main field, compared with the central areas of the main field. This loading effect is a result of the fact that during the etching step, there are no circuit features or other materials present that are etched along the outer periphery of the main field, consequently the reactive species of the etchant increases relative to the main filed since there is less etched material or neutrals along the periphery of the main filed 14 with which the reactive species may combine.

In accordance with the present invention, compensation is made for the reduced area of etchable material along the outer borders of the main field 14 by providing a rectangularly shaped strip 16 of circuit features 24 immediately outside of and contiguous to the outer border 22 defining the main field 14.

Figure 2:
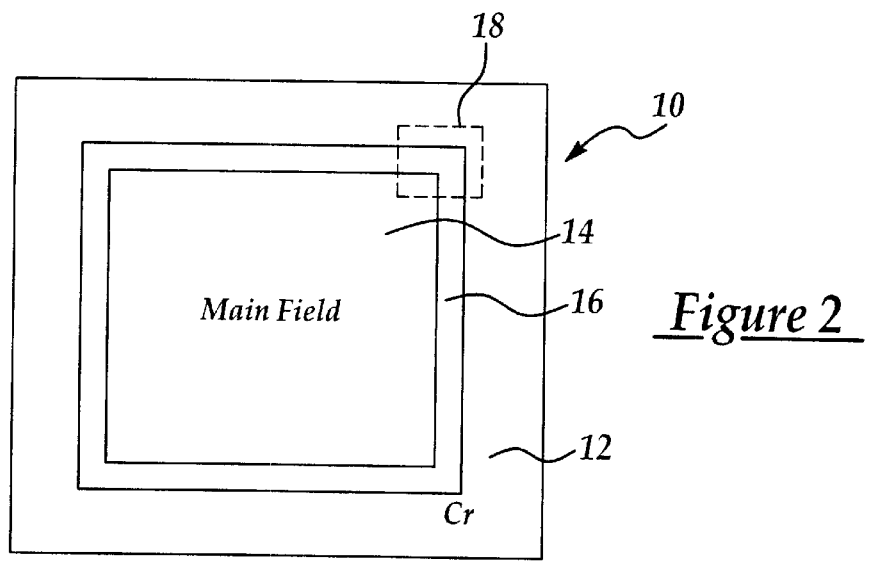
FIG. 2 is a view similar to FIG. 1, but showing modifications of a mask in accordance with the preferred embodiment of the present invention.
Figure 3:
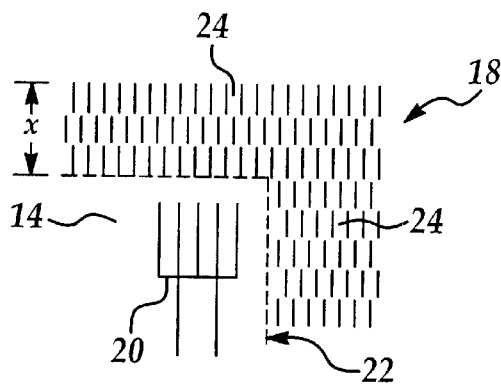
FIG. 3 is a greatly enlarged, fragmentary view of one section of the mask shown in FIG. 2 during an intermediate stage of processing.
Figure 4:
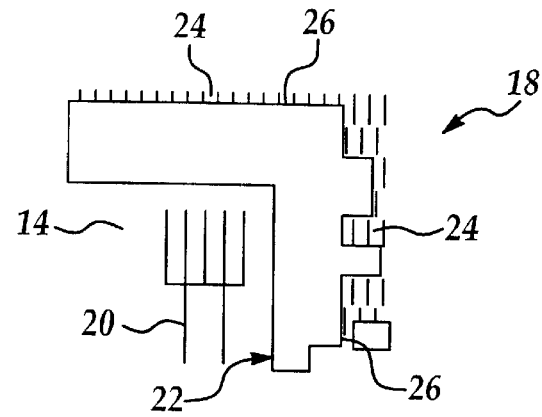
FIG. 4 is a view similar to FIG. 3 but showing the mask after the final stage of processing.

Referring to FIGS. 2–4, one portion of the corner 18 of the main field is shown in greater detail in FIGS. 3 and 4. The dummy field 16 possesses circuit features 24 that are specifically selected to achieve a desired density. The density of the circuit features 24 in the dummy pattern 16 along with the selection of the width X of the dummy field 16 are calculated typically to comprise between 20 and 30% of the total area of the main field 14. However this ratio will be depend on a number of processing variables and the particular application. In one application, it has been found that the width "X" of the dummy field is preferably about five mm.

The circuit features 24 formed in the dummy pattern area 16 are produced using conventional mask making techniques which include depositing a layer of photoresist over the glass plate forming the mask 10 and then using an electron beam or other similar device to pattern the photoresist, following which the photoresist is etched away to form the remaining circuit patters. Preferably, the main field 14 and the dummy field 16 are formed substantially simultaneously, in the same process step after the main and dummy fields 14, 16 have been formed on the mask plate. As shown in FIG. 3, the next step in forming the mask 10 comprises depositing a layer of opaque material 26 over at least those sections of the dummy area 16 which are contiguous to the outer border 22 and the main field 14. The opaque material layer 26 may be carbon, a resin or a metal. A layer of dark carbon film greater than 3000 angstroms thick has been found suitable for masking he dummy area 16. The purpose of the opaque layer 26 is to prevent any of the circuit features in the dummy pattern 16 from being imaged onto the wafer substrate.

From the foregoing, it is apparent that the above described method for making a semiconductor wafer exposure mask is provided comprises the steps of forming a main field pattern and a main field on the mask, forming a dummy field pattern and a dummy field area outside and adjacent to the outer edges of the main filed, and covering the dummy field pattern with a layer of opaque material to prevent the dummy field pattern from being imaged onto the wafer during an exposure of the wafer using the mask.

As a result of the use of a dummy field 14, substantially uniform etch rates are achieved across the entire field 14, including the outer perimeter thereof during an etching process used in forming the circuit patterns 20 or the mask 10. As a result, uniformity of critical dimensions is achieved over the entire field 14 of both the mask 10, and the field imaged onto the semiconductor wafer substrate.

Although the method described above is effective in producing an improved mask, it is less than completely desirable because of the numerous processing steps that are required to form an extra layer of opaque material 26 in overlying relationship to the dummy features 24 that have been etched in the layer of chromium layer 12. In accordance with the present method for producing the improved mask, and the product made thereby, the step of applying an opaque layer of material mentioned above is eliminated, as will now be described.

Figure 5:
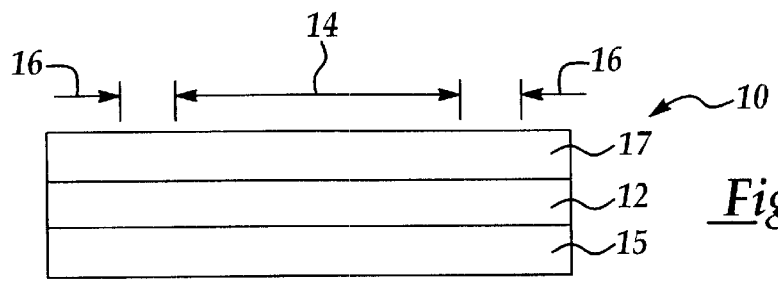
FIGS. 5–9 are cross sectional views of the mask shown in FIG. 2, respectively showing the mask construction at different stages in the manufacture thereof according to the method of the present invention.

Referring to FIG. 5, the mask 10 includes a mask plate 15, formed of a transparent material such as glass or quartz having a layer of metal such as the chromium layer 12 deposited thereon. As in the case of the previously described method, a layer of photoresist 17 is first deposited over the entire chromium layer 12, which includes a main field 14 and a dummy field 16 also as previously described.

Figure 6:
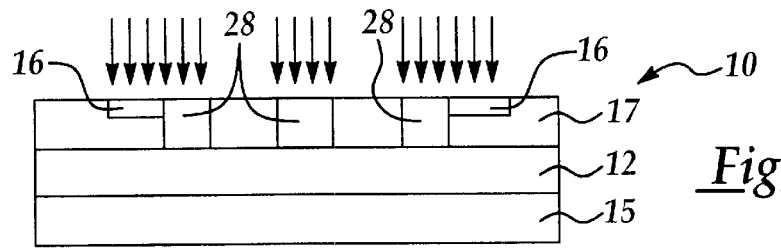
Figure 7:
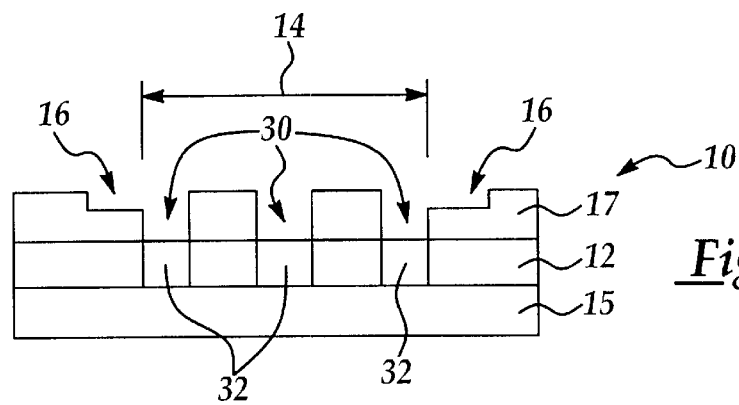
Figure 8:
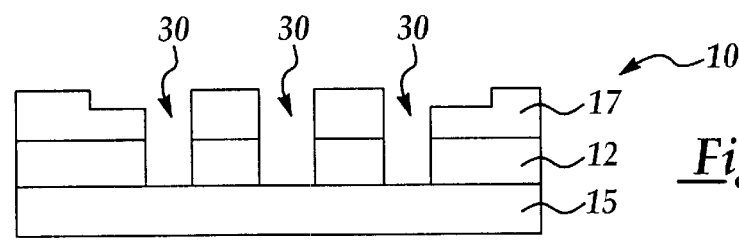

Referring to FIG. 6, the next step in the improved method involves forming both the main field circuit features and the dummy features in the layer of photoresist 17. This is preferably performed by using an electron beam to "write" the desired patterns onto the photoresist 17. Other forms of radiation energy may also be used if desired to pattern the photoresist. Significantly, in accordance with the present invention, the intensity or density levels of the radiation used to pattern the photoresist 17 in the area of the dummy features 16 is less than that used to pattern the circuit features in the main field 14. These two, differing levels of applied radiation are selected such that the level of radiation applied to the photoresist layer in the exposed areas 28 of the main field 14 is sufficient to provide a dosage that reaches through the entire thickness of photoresist layer 17. In contrast, however, a reduced level of radiation is applied to the photoresist forming the dummy features 16, such that the resulting dosage only partially penetrates the thickness of the layer 17. The differing dosages of radiation applied to the two fields 14, 16, causes the photoresist in these two fields to possess differing solubility's when the photoresist is developed. After the layer of photoresist 17 is developed, in a normal manner, the exposed or pattern areas of layer 17 are removed as shown in FIG. 7, but only a portion of the thickness of the photoresist layer 17 is removed, thereby leaving a remaining thickness of photoresist at the inner margin of the dummy area 16, adjoining the main field 14. Next, the mask 10 is subjected to an etching process, which may be for example, dry etching, wherein those portions of the metal layer 12 exposed by the vias 30, are etched away, thereby forming circuit features defined by the portions of the metal layer 12 that are present beneath the remaining sections of photoresist in the main field. The state of the mask 10 following the etching step is shown in FIG. 8. As may be appreciated from both FIGS. 7 and 8, that portion of the photoresist layer 17 and the dummy field 16 that remains following development of the photoresist layer 17, protectively overlies and covers the metal layer 12 that lying outside of the main field 14.

Figure 9:
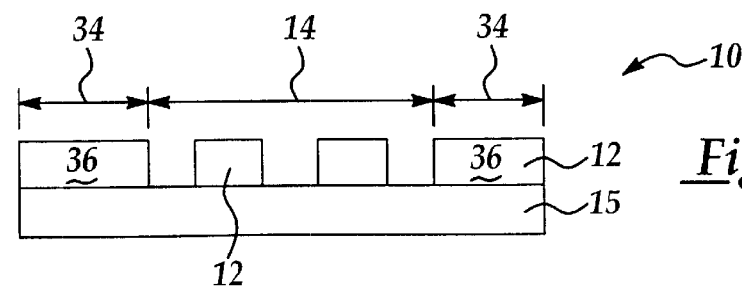

FIG. 9 shows the mask 10 following the step of removing all of the remaining photoresist layer 17. This view shows the A mask 10 and its finished state, depicting the main field 14 of circuit features surrounded by a strip 36 of the metal layer 12. It mat be appreciated that since the metal strip 36 was not subjected to etching, no features are formed therein which would be imaged onto the semiconductor wafer. Accordingly, there is no need for a further processing step to apply opaque barriers to prevent undesired features from being imaged through the mask, as was the case in the mask making method first described above.

From the foregoing, it is apparent that the novel mask and method for making the same described above not only provides for the reliable accomplishment of the objects of the invention, but it does so in a particularly economical and efficient manner. It is recognized, of course, that those skilled in the art may make various modifications or additions to the preferred embodiment chosen to illustrate the invention without departing from the spirit and scope of the present contribution to the art. Accordingly, it is to be understood that the protections sought and to be afforded hereby should be deemed to extend to the subject matter claimed and all equivalents thereof fairly within the scope of the invention.

What is claimed is:

1. A method of making a mask used in a photolithography process to image a pattern of circuit features onto the surface of a semiconductor wafer, comprising the steps of:

(A) providing a transparent mask plate having a layer of metal formed on one side thereof;

(B) forming a layer of photoresist material over a first area of said metal layer defining a main field in which circuit features are to be formed, and over a second area on said metal layer defining a dummy field in which dummy circuit features are to be formed, wherein said dummy field is contiguous to and completely surrounds the outer edges of said main field;

(C) exposing said photoresist layer in said first area thereof with radiation having a first energy density;

(D) exposing said photoresist layer in said second area thereof with radiation having a second energy density less than said first density whereby the photoresist layer in said first and second areas possess differing solubilities in the presence of a developing solution;

(E) developing and etching said photoresist layer such that a portion of said photoresist layer in said second area thereof remains covering said metal layer, said remaining portion of said photoresist layer preventing said dummy circuit features from being imaged onto said wafer; and (F) selecting the pattern density for said dummy field relative to the pattern density for said main field such that the etch rate at said outer edges of said main field is substantially equal to the etch rate of said dummy field.

2. The method of claim 1, wherein:

step (B) includes forming a strip of said photoresist material around the outer periphery of said main field, and step (D) includes exposing only a portion of said strip.

3. The method of claim 1, wherein steps (C) and (D) are performed using an electron beam.

4. The method of claim 1, wherein:

step (B) includes depositing a layer of photoresist generally about 8000 angstroms thick, step (C) includes subjecting said first area of said photoresist to radiation having an energy density generally about 24 micro-coulombs per square meter, and, step (D) includes subjecting said second area of said photoresist to radiation having an energy density generally about 10 micro-coulombs per square meter.

5. The method of claim 1, wherein said second density is generally about one-half of said first energy density.

6. A method of making a semiconductor wafer exposure mask having improved pattern uniformity, comprising the steps of:

(A) forming a main field pattern in a main field on said mask by (i) forming a layer of photoresist over a metal layer in said main field, (ii) selectively exposing said photoresist layer to a first level of radiation, (iii) developing said photoresist layer whereby to form a pattern over said metal layer corresponding to said main field pattern, (iv) etching said metal layer using said pattern;

(B) forming a dummy field pattern on said mask in a dummy field area completely surrounding and contiguous to the outer edges of said main field, said dummy field area being formed by (i) forming a layer of photoresist over a metal layer in said dummy field area, (ii) exposing at least portion of said photoresist of said photoresist layer in said dummy field area to a second level of radiation, said second level of radiation being less than said first level, (iii) developing said photoresist layer in said dummy field area simultaneously with the development of said photoresist layer in said main field, the dosages applied to said photoresist layer in said dummy field area being such that a thickness of said photoresist remains in said dummy field area following developing thereof, said remaining thickness of photoresist preventing the etching of said metal layer in said dummy field area, whereby to prevent said dummy field pattern from being imaged onto said wafer during an exposure of said wafer using said mask;

(C) etching the developed photoresist layers; and, (D) selecting the pattern density for said dummy field area relative to the pattern density for said main field area such that the etch rate at said outer edges of said main field area is substantially equal to the etch rate of said dummy field area.

7. The method of claim 6, wherein said exposing is performed using a beam of electrons.

8. A method of making a mask used in a photolithography process to image a pattern of circuit features onto the surface of a semiconductor wafer, comprising the steps of:

(A) forming a main field pattern of circuit features on a mask plate, the circuit features imaged onto said plate along the outer periphery of said main field pattern ordinarily tending to etch at a faster rate during etching of said plate following exposure of said main field pattern onto a layer of photoresist on said plate compared to the etch rate of circuit features imaged onto a central area of said plate;

(B) forming a dummy field pattern of dummy features on said plate contiguous to and surrounding said main field pattern, the presence of said dummy features on said plate reducing loading of the rate of etching of exposed photoresist along the outer periphery of said main field pattern, said dummy field pattern forming step including exposing a layer of photoresist used to form said dummy features to a dosage of radiation less than the dosage of radiation applied to the layer of said photoresist used to form said main field pattern, whereby a portion of the thickness of the dummy field features remains after etching is complete; and, (C) selecting the pattern density for said dummy field pattern relative to the pattern density for said main field pattern such that the etch rate at said outer periphery of said main field pattern is substantially equal to the etch rate of said dummy field pattern.

* * * * *